United States Patent
Sivadas et al.

(10) Patent No.: US 8,412,136 B2
(45) Date of Patent: Apr. 2, 2013

(54) MEASURING LOAD IMPEDANCE OF AN AMPLIFIER DRIVING A VARIABLE LOAD

(75) Inventors: Apu Sivadas, Bangalore (IN); Gireesh Rajendran, Trivandrum (IN); Subhashish Mukherjee, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 568 days.

(21) Appl. No.: 12/368,995

(22) Filed: Feb. 10, 2009

(65) Prior Publication Data

US 2009/0201088 A1 Aug. 13, 2009

(30) Foreign Application Priority Data

Feb. 12, 2008 (IN) .............................. 359/CHE/2008

(51) Int. Cl.
*H01Q 11/12* (2006.01)
*H04B 1/04* (2006.01)

(52) U.S. Cl. ................... 455/127.1; 455/115.1; 455/107; 455/123

(58) Field of Classification Search ................ 455/127.1, 455/115.4, 115.1, 107, 123
See application file for complete search history.

(56) References Cited

U.S. PATENT DOCUMENTS

| | | | |
|---|---|---|---|
| 6,528,983 | B1 | 3/2003 | Augustine |
| 7,058,372 | B1 | 6/2006 | Pardoen et al. |
| 2004/0239428 | A1* | 12/2004 | Apel .............................. 330/279 |
| 2005/0059362 | A1* | 3/2005 | Kalajo et al. ................ 455/127.1 |
| 2005/0227640 | A1* | 10/2005 | Haque et al. ................... 455/126 |
| 2006/0052066 | A1* | 3/2006 | Cleveland et al. ............. 455/101 |

OTHER PUBLICATIONS

James T. Aberle, Bertan Bakkaloglu, Chaitali Chakrabarti, Sung-Hoon Oh, Hang Song, Animesh Adhya, Kathleen L. Melde, Richard B. Whatley and Zhen Zhou. "Automatically Tuning Antenna for Software-Defined and Cognitive Radio". Proceeding of the SDR 05 Technical Conference and Product Exposition, Year 2005, p. 1 to 6.

* cited by examiner

*Primary Examiner* — Quan Tra
(74) *Attorney, Agent, or Firm* — Wade J. Brady, III; Frederick J. Telecky, Jr.

(57) ABSTRACT

According to an aspect of the present invention, the magnitude and phase angle of looking-in impedance driven by an amplifier are computed in digital domain during normal operation within a module containing the amplifier. In an embodiment, the computed magnitude and phase angle are used for impedance matching at a node driven by the amplifier. As a result, impedance matching may be obtained even in situations when the impedance changes during operation.

20 Claims, 5 Drawing Sheets

MEASURING LOAD IMPEDANCE OF AN AMPLIFIER DRIVING A VARIABLE LOAD

RELATED APPLICATION(S)

The present application claims the benefit of co-pending India provisional application serial number: 359/CHE/2008, entitled: "On chip RF impedance & VSWR detection", filed on Feb. 12, 2008, naming Texas Instruments Inc. (the intended assignee) as the Applicant, and naming the same inventors as in the present application as inventors, and is incorporated in its entirety herewith.

BACKGROUND OF THE INVENTION

1. Technical Field

Embodiments of the present disclosure relate generally to amplifiers, and more specifically to measuring load impedance of an amplifier driving a variable load.

2. Related Art

An amplifier is a circuit and/or a component, which amplifies an input signal, and provides the amplified signal at a corresponding output node. Circuits or components connected to an output node on which the amplified output is provided are termed as a load. A load may be associated with a corresponding impedance, which may contain both a resistive part (character of a resistor) as well as a reactive part (character of a capacitance/inductance).

In several scenarios, the impedance of a load presented to an amplifier varies with time. For example, the load impedance presented by an antenna to a power amplifier may vary (the resistive part or the reactive part or both) due to changes in the environment of antenna operation (for example, depending on the nature and location of objects in the vicinity of the antenna).

In other scenarios, circuit structures or components constituting the load may be replaced by a different circuit or component by a user or systems integrator, thereby causing the load to the amplifier to be changed (from a value that the amplifier was originally designed to operate with).

Measurement of the value of a load impedance connected to an amplifier is often desirable. The measured value can be used, for example, to ensure maximum power transfer to the load and to reduce damages to the output stages of the amplifier. It may accordingly be desirable to measure the load impedance of an amplifier driving a variable load.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

According to an aspect of the present invention, the magnitude and phase angle of looking-in impedance driven by an amplifier are computed in digital domain during normal operation within a module containing the amplifier. The module may contain one or more integrated circuits.

In an embodiment, the computed magnitude and phase angle are used for impedance matching at a node driven by the amplifier. As a result, impedance matching may be obtained even in situations when the impedance changes during operation.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE VIEW OF DRAWINGS

Example embodiments of the present invention will be described with reference to the accompanying drawings briefly described below.

The drawing in which an element first appears is indicated by the leftmost digit(s) in the corresponding reference number

DETAILED DESCRIPTION

Various embodiments are described below with several examples for illustration.

1. Example Embodiment

Figure 1:
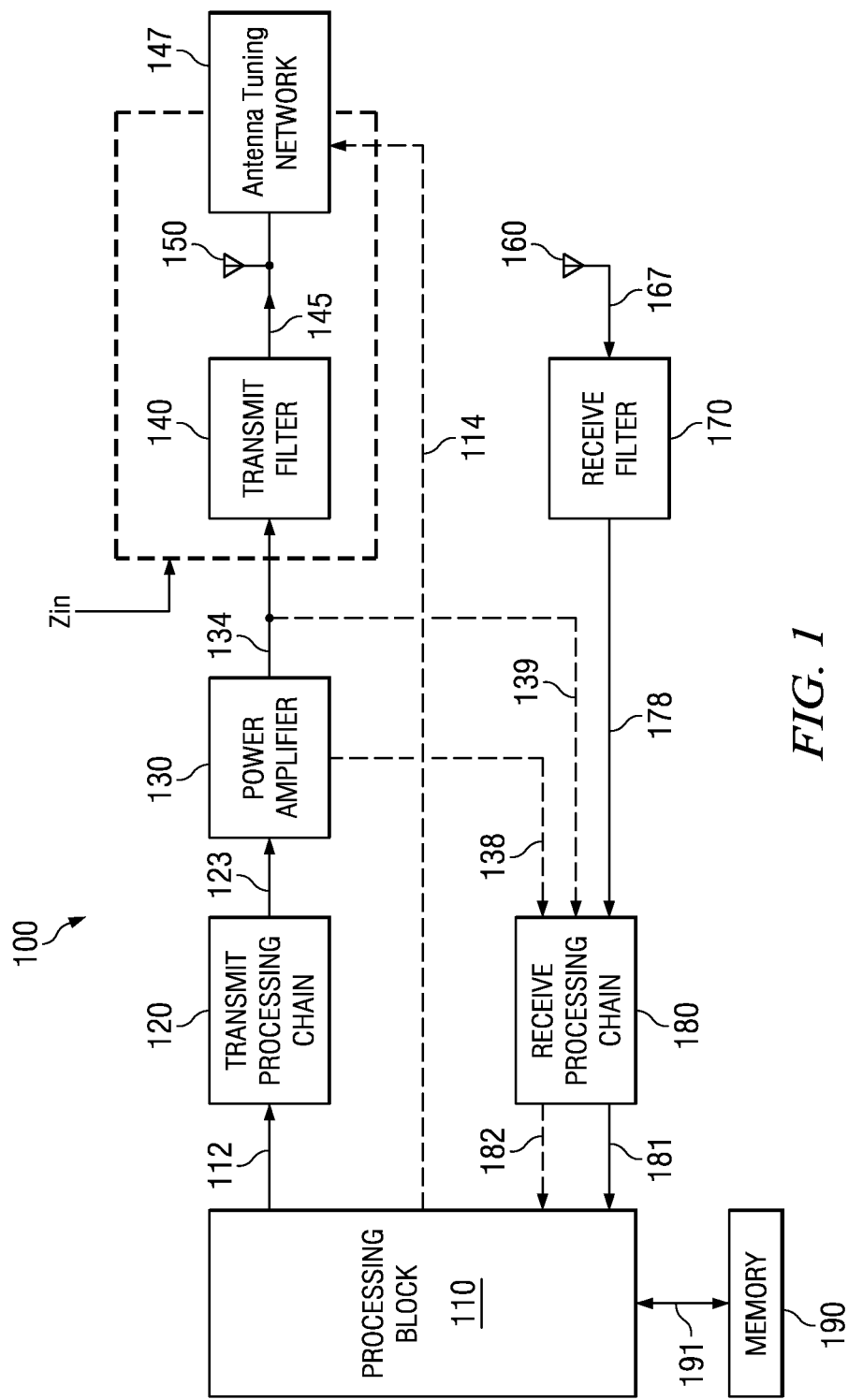
FIG. 1 is a block diagram of a module, illustrating the details of an example embodiment in which several aspects of the present invention can be implemented.

FIG. 1 is a block diagram of a module (100), illustrating the details of an example embodiment in which several aspects of the present invention can be implemented. Module 100 may correspond to, for example, an integrated circuit (IC)/SoC (System-on-chip), bare-die(s) (chips), system-in-package (SiP), a multi-chip module (MCM), a hybrid IC or, in general, any form of assembly/packaging in which one or more ICs can be provided.

Module 100 may implement, for example, a Bluetooth transceiver, GSM chipset, orthogonal frequency division multiplexing (OFDM) transceivers, etc., implemented as a System-on-Chip (SoC). Depending on the specific implementation scenario, module 100 may be powered by batteries or regulated power supplies (both not shown in FIG. 1). Module 100 is shown containing processing block 110, transmit processing chain 120, power amplifier 130, transmit filter 140, antenna tuning network 147, antenna 150, antenna 160, receive filter 170, and receive processing chain 180.

The block diagram of FIG. 1, as well as the corresponding description below are provide merely by way of illustration, and various other blocks, sub-blocks and/or topologies can also be used to implement module 100, as would be apparent to one skilled in the relevant arts. For example, processing block 110, transmit processing chain 120, and receive processing chain 180 may, in combination, be implemented as one IC, and power amplifier 130, transmit filter 140, receive filter 170, antennas 150 and 160 and antenna tuning network 147 may, in combination, be implemented as another IC, with the two ICs being packaged as a multi-chip module (MCM). In some implementation scenarios, antennas 150 and 160, antenna tuning network 147 and filters 140 and 170 may be separate units, not integrated on-chip or on-module.

Processing block 110 generates digital data representing information to be transmitted, and provides the data to transmit processing chain 120. Processing block 110 receives digital data (representing received information) from receive processing chain 180 on path 181. Processing block 110 may perform several baseband processing operations on data to be transmitted (path 112), as well as data that are received (path 181). The operations may include signal processing operations such as filtering, encoding, decoding, encryption, decryption, etc. Processing block 110 may contain multiple processing units, with each processing unit potentially being designed for a specific task. Alternatively, processing block 110 may contain only a single processing unit (general purpose processor, digital signal processor, etc).

Memory 190 represents a storage medium, and may correspond to random access memory (RAM), read-only memory (ROM), flash memory etc. Processing block 110 may execute instructions stored in memory 190 (and received on path 191) to perform corresponding operations and features/applications. Processing block 110 may also contain memory internally.

Transmit processing chain 120 modulates a carrier signal (generated internally, not shown) with the digital data received on path 112. Alternatively, assuming analog modulation is used, transmit processing chain 120 may convert the digital data to analog form before modulation. Transmit processing chain 120 may perform other processing operations such as up-conversion, filtering of unwanted sidebands, etc, on the modulated carrier signal. Transmit processing chain 120 provides a processed signal on path 123 which may be, for example, at radio frequencies (RF).

Power amplifier 130 provides power amplification to the signal received on path 123 (which may, for example, be an audio signal), and provides a corresponding power-amplified output on path 134. Transmit filter 140 may perform further band-limiting on the signal received on path 134, and provides a filtered signal on path 145 to antenna 150. Antenna tuning network 147 are connected to path 145 in shunt or in series or as a shunt-plus-series combination, or to antenna 150, and operates to adjust the impedance of antenna 150 (and therefore Zin) to a desired value. Antenna tuning network may receive control inputs from processing block 110 on path 114 to provide the impedance adjustment. Antenna tuning network 147 may be implemented, for example, as a bank of capacitors whose capacitances are adjustable via path 114. Antenna 150 transmits the received signal on a wireless medium.

Antenna 160 receives an input signal (e.g., at RF), and provides the received input signal on path 167 to receive filter 170, which may perform front-end filtering operations. Receive filter 170 provides a filtered signal to receive processing chain 180 on path 178. Receive processing chain 180 performs operations to recover the information in the signal received on path 178. The operations performed by receive processing chain 180 may include, down-conversion, demodulation, analog to digital conversion, etc., and receive processing chain 180 may internally contain corresponding circuits/components (e.g., mixers, demodulation blocks, analog-to-digital converter, etc.).

Receive processing chain 180 provides (on path 181) to processing block 110, digital data representing the information in the input signal received by antenna 160. Although shown as separate blocks, at least some portions (and operations) of processing block 110, transmit processing chain 120 and receive processing chain 180 may be combined in a single block such as a digital signal processor, with the digital signal processor performing some or all of the operations performed by transmit processing chain 120 and receive processing chain 180 in the digital domain.

Further, although not shown in FIG. 1, impedance matching networks (e.g., controlled impedance tracks, ac, dc terminations, etc.) may be used in various portions or interconnection paths of module 100 that process or forward high frequency signals, such as for example, between power amplifier 130 and transmit filter 140, and between transmit filter 140 and antenna 150.

With respect to FIG. 1, the combination of transmit filter 140 and antenna 150 (including impedance matching networks on paths 134 and 145, as noted above, but not shown in FIG. 1) present a load to power amplifier 130. The load impedance is denoted as Zin in FIG. 1, and may be viewed as the impedance at node 134 "looking-in" in the direction of arrow 134. Thus, Zin at output node of power amplifier 130 is referred to as a looking-in impedance, and power amplifier 130 "drives" the looking-in impedance.

Zin may contain both a resistive part (Rin) and a reactive part (Xin), and may be expressed as the sum [Rin+jXin]. Alternatively, Zin may be expressed in polar coordinate form as an amplitude (Mag[Zin]) and a phase angle Φ([Zin], with the following well-known relationships with respect to Rin and Xin:

$$|Zin| = \sqrt{(Rin)^2 + (Xin)^2}$$
$$\angle Zin = \arctan\left[\frac{Xin}{Rin}\right]$$

wherein, $|Z_{in}|$ represents the magnitude of impedance Zin, $\angle Z_{in}$ represents the phase angle of Zin, and 'arctan' represents an 'inverse of tangent' operation.

As noted above, load impedance Zin may be a variable load. It may be desirable to measure the value of Zin in real-time (during operation of module 100, as against during 'offline' testing), and using circuits provided within module 100. It should be noted that offline testing implies that test equipment, which is not part of module 100, may be used to measure any of the parameters of interest within the module.

As an example, assuming module 100 is incorporated in a mobile device (e.g., mobile phone), the location and orientation of antenna 150, as well as objects in the neighborhood of antenna 150 may change with time. As a result, impedance of antenna 150 may change, resulting in changes in impedance Zin, thereby causing changes to the power transferred by power amplifier 130 to antenna 150. Thus, the transmitted (radiated power) may therefore vary as a result. It may be desirable to correct for such variations, which in turn may require a "real-time", "on-chip" measurement of Zin.

Variations in Zin may result in improper impedance matching between output impedance of power amplifier 130 and Zin, resulting in a standing wave to be generated on path 134. Depending on the extent of impedance mismatch, an anti-node (peak of the standing wave) of the standing wave may be present at output terminal (134) of power amplifier 130, with a high voltage at the anti-node capable of causing damage to some of the output component(s) (e.g., a power transistor) within power amplifier 130.

Alternatively, a node (trough of the standing wave) may be present at output terminal 134 of power amplifier 130, causing a short circuit to ground (or at least an increase in the output current of power amplifier 130), thereby again damaging the output component(s). Further, power amplifier 130 and hence the output component(s) may be designed to operated at low voltages (e.g., in low-voltage CMOS technology implementations), and reliability of the output component(s) may be adversely affected due to the effects noted above. Accommodating such large voltages or currents at the output of power amplifier 130 may require a significant "overdesign" of power amplifier 130, leading to increased cost and/or power consumption, and therefore may not be desirable.

Another effect that may occur, with a varying Zin, is that the reactive component Xin may become non-zero (or very large), causing the power actually transferred to antenna 150 (and therefore the power that is transmitted) to be much less than the DC power consumed in power amplifier 130 (thereby reducing the efficiency of power amplifier 130). Thus, the value of reactive part (Xin) may be considered to be indicative of the power transferred to antenna 150, while the value of Zin may have adverse impacts on the reliability of power amplifier 130. Measurement of the value of Zin may be desirable, at least for correcting or minimizing the undesired effects noted above. Further, measurement of Zin enables detection of fault conditions such as a disconnected, improperly connected or defective antenna (150).

In an embodiment, circuitry and techniques are provided within a module (on-module) to measure the load impedance of an amplifier driving a variable load. In one embodiment, additional circuitry is provided within power amplifier 130, and the output of the circuitry is provided on path 138 to receive processing chain 180. Receive processing chain 180 processes signals received on path 139 (which contains output 134 of power amplifier 130) and path 138, and forward the results of the processing to processing block 110 on path 182. Processing block 110 further processes signals 139 and 138 to determine Zin, and may operate to adjust (via path 114) the impedance of antenna 150 (and therefore Zin).

2. On-Module Load Impedance Measurement

Figure 2:
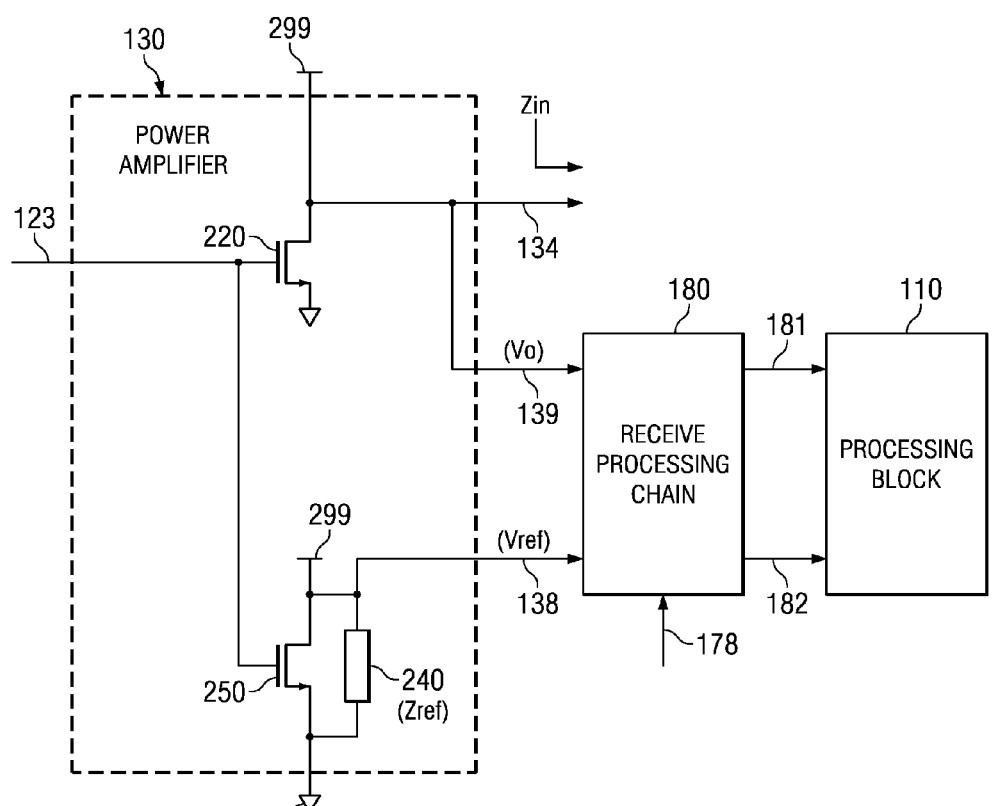
FIG. 2 is a block diagram illustrating (portions of) the implementation details of a module in an embodiment.

FIG. 2 is a block diagram illustrating (portions of) the implementation details of a module in an embodiment of the present invention. In FIG. 2, power amplifier 130 is shown containing NMOS transistors 220 and 250, and on-chip reference impedance 240 (Zref). Power amplifier 130 may contain other components/circuits or amplification stages, but not shown in FIG. 2, as being deemed not relevant for an understanding of the described embodiments. Receive processing chain 180 and processing block 110 are also shown in FIG. 2. Terminals 299 and 298 represent power and ground terminals (constant potential terminals, in general).

NMOS transistor 220 (which may be a power transistor), receives signal 123, and provides a power-amplified signal Vo on path 134 (to transmit filter 140 and antenna 150 of FIG. 1). In addition, output 134 is also provided to receive processing chain 180 via path 139 (Vo). The signal on each of paths 134 and 139 is referred to as Vo.

A reference impedance Zref (240) of known (predetermined) impedance value is connected as a load to output 138 of NMOS transistor 250. NMOS transistor 250 (which may be viewed as an auxiliary transistor) also receives signal 123, and provides an output Vref (138). Vref (138) and Vo (139) are amplified versions of input signal 123. Vref (138) is also provided to receive processing chain 180. Auxiliary NMOS transistor 250 (which may be viewed as an auxiliary power amplifier as well) may have the same dimensions (e.g., same width) as "main" NMOS transistor 220, or have dimensions, that are a fraction (1/N) of those of NMOS transistor 220.

Receive processing chain 180 down-converts each of signals Vo (139) and Vref (138) to a lower frequency (intermediate frequency/IF), performs analog-to-digital (A/D) conversion of the signals at IF, and provides the corresponding digital representations (digital codes) to processing block 110 via path 182. Processing block 110 computes the value of Zin based on the values received on path 182, and the value of Zref, as expressed by the following equations:

$$Zin = (Vo * Zref) / (N * Vref) \quad \text{Equation 1}$$

Wherein,

N represents the ratio of the dimensions (e.g., width) of transistor 220 and transistor 250. The accuracy obtainable in the computation of Zin depends (among other factors) on the accuracy with which Zref is implemented. In general, greater the accuracy with which Zref is implemented, greater is the accuracy of measured Zin. In an embodiment, Zref is implemented as an on-chip resistor with a highly accurate resistance value (Rref), thereby enabling accurate measurement of Zin.

It may be verified from FIG. 2, that since both transistors 220 and 250 receive the same input 123, corresponding outputs Vo and Vref are related as given by equation 1. Zref and N being known (predetermined), a measurement of Vo and Vref allows computation of Zin. It may be appreciated that while auxiliary transistor 250 is shown as being contained within power amplifier 130, in other embodiments auxiliary transistor 250 may be implemented external to power amplifier 130. In case of implementation within power amplifier 130, auxiliary transistor 250 may be embedded as one segment within power amplifier 130 to obtain optimal matching between the main and auxiliary amplifiers.

Vo and Vref may be measured by any of several well-known techniques. The manner in which Vo and Vref are measured in an embodiment is described next with respect to FIGS. 3 and 4.

Figure 3:
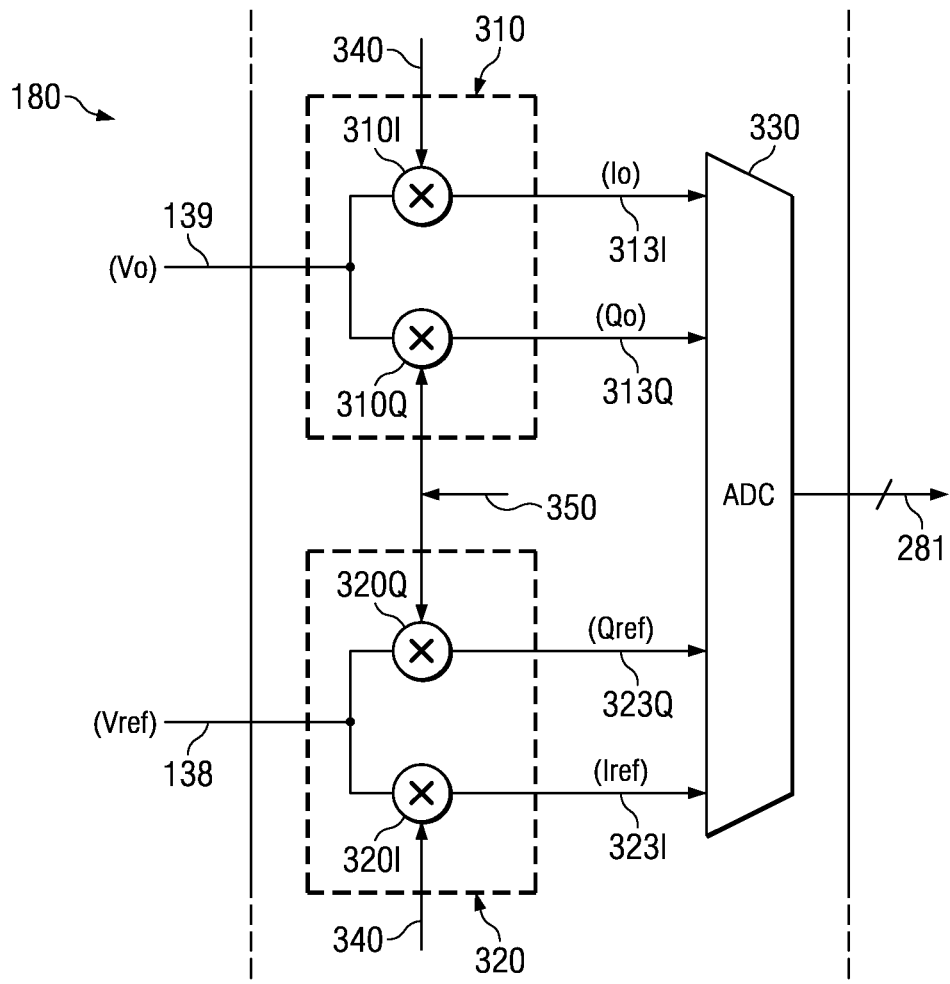
FIG. 3 is a block diagram illustrating partial internal details of a receive processing chain in an embodiment.

FIG. 3 is a block diagram illustrating partial internal details of receive processing chain 180, in an embodiment. The diagram is shown containing mixer blocks 310 and 320, and analog to digital converter (ADC) 330. Mixer block 310 contains 'in-phase' mixer 310I and 'quadrature-phase' mixer 310Q. Mixer block 320 contains 'in-phase' mixer 320I and 'quadrature-phase' mixer 320Q.

Each of in-phase mixers 310I and 320I receives an 'in-phase' carrier signal on path 340, and each of quadrature-phase mixers 310Q and 320Q receives a 'quadrature-phase' carrier signal on path 350, from corresponding components, not shown. The in-phase and quadrature-phase carriers have a 90 degrees phase difference, and are used to down-convert Vo and Vref to a lower (intermediate or IF) frequency.

Signal Vo (139) is provided as the second input to mixers 310I and 310Q, and is mixed with carriers 340 and 350, to generate corresponding down-converted I and Q components 313I (Io) and 313Q (Qo). Signal Vref (138) is provided as the second input to mixers 320I and 320Q, and is mixed with carriers 340 and 350, to generate corresponding down-converted I and Q components 323I (Iref) and 323Q (Qref).

ADC 330 converts each of the four signals 313I (Io), 313Q(Qo), 323I (Iref) and 323Q(Qref) to corresponding digital codes, and provides the digital codes to processing block 110 on path 281.

Processing block 110 computes the magnitude of Zin according to equation 2 below:

$$|Z_{in}| = \frac{\sqrt{(Io)^2 + (Qo)^2}}{\sqrt{(Iref)^2 + (Qref)^2}} \frac{1}{N} Z_{ref} \qquad \text{Equation 2}$$

wherein, $|Z_{in}|$ represents the magnitude of impedance Zin.

Figure 4:
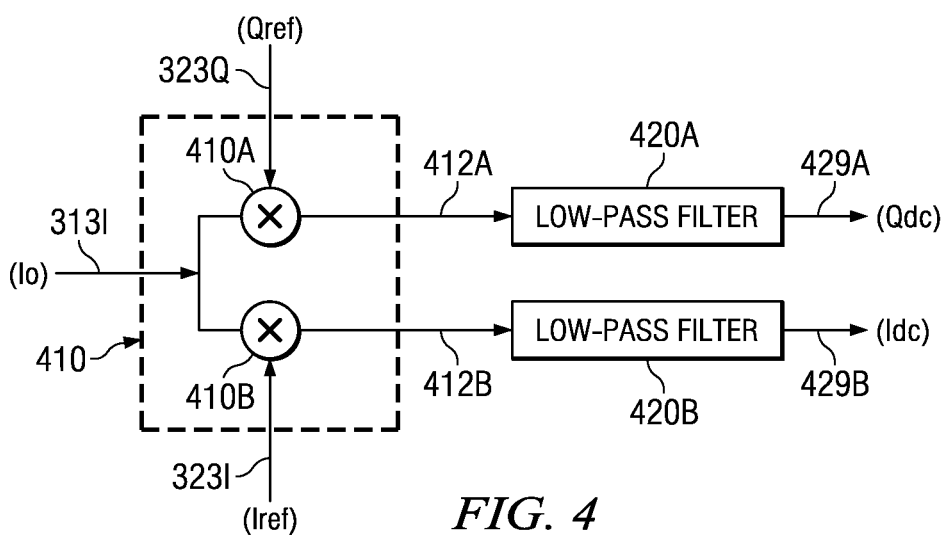
FIG. 4 is a block diagram representing operations performed by a processing block to compute phase angle of an impedance in an embodiment.

In an embodiment, to obtain the phase angle of Zin, processing block 110 mixes digitally Io (313I) with each of Qref (323Q) and Iref(323I). The corresponding mixing operations are illustrated in FIG. 4. Mixers 410A and 410B shown contained in mixer block 410 represent corresponding mathematical operations using instructions performed by processing block 110 in the digital domain.

Low-pass filters 420A and 420B, which are also implemented as mathematical operations in the digital domain (e.g., FIR, IIR filters, etc.) within processing block 110, perform low-pass filtering on the outputs 412A and 412B of respective mixers 410A and 410B, to provide signals 429A (Qdc) and 429B (Idc). Processing block 110 computes the phase angle of Zin according to equation 3 below:

$$\angle Z_{in} = -\arctan\left[\frac{Q_{dc}}{I_{dc}}\right] \qquad \text{Equation 3}$$

wherein, $\angle Z_{in}$ represents the phase angle of Zin,

Qdc and Idc equal outputs 429A and 429B respectively of FIG. 4.

It is noted that the phase angle of Zin may be computed by other well-known techniques as well, without requiring the mixing operations noted with respect to FIG. 4. For example, $\angle Z_{in}$ can be obtained from the phase difference between Io and Iref and Qo and Qref in a known way. However, it is noted that phase difference computation using a phase detector approach may be practically difficult to implement circuit-wise since the signals Io and Iref may have significantly different signal levels (typically the strength of Io is much greater than the strength of Iref). Further, direct phase detection may require converting the signals (Io, Iref, Qo and Qref) to square wave using comparators/slicers. It may be appreciated that since the technique illustrated with respect to FIG. 4 (being performed in the digital domain as mathematical operations) does not require phase detection or slicing, and hence obviates the requirement to implement the corresponding hardware resources (phase detectors, slicers, etc.), thereby minimizing implementation area and/or power.

To improve accuracy in the measurement of Zin, as well as to avoid processing of DC signals within receive processing chain 180, RF signal 123 may be generated at a frequency equal to (LO+IF), wherein LO represents the frequency of in-phase and quadrature-phase carriers on paths 340 and 350 respectively, and IF represents the down-converted carrier frequency of signals 313I (Io), 313Q (Qo), 323Q (Qref) and 323I (Iref). The selection of the IF frequency may be based on the specific implementation and operational requirements of receive processing chain 180.

Although receive processing chain 180 is shown in FIG. 3 as containing separate mixer blocks 310 and 320, a single mixer block may instead be used in a time-multiplexed manner. In such an approach, a switch may be used to alternately connect one of Vo (139) and Vref (138) to a voltage-sensing circuit. The voltage-sensing circuit provides Vo (139) and Vref (138) at corresponding time intervals to a single mixer block (e.g., similar to block 310 or block 320). Although not shown in the Figures, Vo (139) and Vref (138) may be gained by a gain block (optional) before being provided to receive processing chain 180.

Further, it may be appreciated that while processing block 110 is described as processing down-converted signals, the analog down-conversion performed by receive processing chain 180 may not be used, and ADC 330 may instead be implemented to provide digital codes representing signals Vo (139) and Vref (138) directly to processing block 110. Processing block 110 may then directly process the codes in the digital domain to compute Zin. In general, the portions of receive processing chain 180 described with respect to FIG. 3 and processing block 110 may in combination be viewed as a "computation block", and computation in digital domain implies that each of the magnitude and the phase angle is formed as a corresponding number.

The approaches described above enable measurement of the magnitude as well as the phase (and therefore the resistive and reactive parts) of load impedance Zin. It may be appreciated that the approach does not require the use of devices external to module 100, such as directional couplers, matching terminations etc., which may be bulky in size, and therefore not desirable. Further, since no components are added in series with paths 134 or 145, no insertion loss is incurred while performing the measurement of Zin. It may be also be appreciated that the value of 'N' (ratio of the dimensions of transistor 220 and transistor 250) may be selected to be large (e.g., in the range 100 to 200), such that the implementation of auxiliary transistor 250 requires negligible additional area on module 100.

Further, it may also be appreciated that, since circuitry for measuring Zin is incorporated within module 100, the measurement of Zin may be performed even while module 100 is operational. For example, assuming module 100 is used to implement time-division multiplexed (TDM) communication, receive processing chain 180 may be used to perform Zin measurement while transmit processing chain 120 is active in a transmission interval. If module 100 is deployed in the context of a frequency division multiplexing (FDM) system, an auxiliary low-complexity receive processing chain (requiring only a low bit-width ADC, e.g., 4-bit ADC) may be implemented within module 100, in addition to receive processing chain 180, to perform the operations described with respect to FIG. 3.

The value of $|Z_{in}|$ enables processing block 110 to compute the absolute value of power delivered to antenna 150 (FIG. 1), and in turn to adjust parameters such as currents and/or voltages within power amplifier 130 (e.g., in transistor 220) such that a known/prescribed value of power is transferred to load impedance Zin, thereby enhancing transmission efficiency. Accurate measurement of power transferred enables optimum use of battery and extends battery life in embodiments operated using battery power such as, for example mobile devices). Adjustment of the parameters noted above may be effected by gate bias control (of transistor 220), adjustment of value of power supply 299, etc. Processing block 110 may provide signals on path 114 to antenna tuning network 147, to tune out (cancel) or adjust the reactive (e.g., capacitive) part of the input impedance of antenna 150 to enable maximum power to be transferred from power amplifier 130 to antenna 150. In general, processing block 110 may operate to adjust the characteristics (e.g., current drive, gain, etc.) of power amplifier 130 and/or antenna 150 (via adjustment of antenna tuning network 147) to match the output impedance of power amplifier and looking-in impedance (Zin).

It is noted that the approaches described above support several modulation techniques to be employed in transmit processing chain 120, including OFDM. The measurement of Zin may be rendered particularly accurate when signal amplitudes (e.g., on path 134) are small (corresponding to, for example, a linear operational range of transistors 220 and 250 of FIG. 2). Further, the approaches enable module 100 (FIG. 1) or a device incorporating module 1, to determine fault conditions noted above (disconnected, improperly connected or defective antenna (150).

The techniques described above also enable measurement of VSWR (voltage standing wave ratio) at the drain (output) terminal (connected to path 134) of transistor 220. VSWR at the drain terminal of transistor 220 can be computed based on the measured Zin, using the well-known relationships provided below:

$$S_{11}=[(Zin-Zo)/(Zin+Zo)] \quad \text{Equation 4}$$

wherein, $S_{11}$ is the coefficient of reflection of path 134, and

Zo represents a standard impedance (e.g., 50 ohms), or alternatively the output impedance of transistor 220 (or the output impedance of power amplifier 130, in general).

$$VSWR=[(1+|S_{11}|)/(1-|S_{11}|)] \quad \text{Equation 5}$$

wherein, $|S_{11}|$ represents the magnitude of $S_{11}$.

By implementing corresponding circuitry within module 100 (or alternatively, based on external inputs), power amplifier 130 (or transistor 220) can be powered down under damaging VSWR conditions (e.g., high voltage at drain of transistor 220), thereby enhancing the reliability of transistor 220, and module 100 in general.

Provision of signal 139 (Vo) also enables processing block 110 to computation of amplitude-to-amplitude (AM2AM) and amplitude-to-phase (AM2PM) distortion curves of power amplifier 130. AM2AM distortion refers to the deviation in the gain (output signal 134/input signal 123) of the amplifier from a constant value, and which may result from non-linear effects in power amplifier 130 (e.g., in transistor 220). AM2PM refers to the phase difference between output 134 and input 123. Ideally the phase difference should be a constant for all input (123) levels. Deviations from such a constant value (for example, as measured corresponding to a smallest value of input 123) are termed as AM2PM distortion.

In an embodiment, processing block 110 causes voltages of pre-determined amplitudes to be provided (sequentially, in a swept manner) as inputs to power amplifier 130, and measures amplitudes and phases of Vo (139) corresponding to each of the inputs. Based on the input voltages and the corresponding amplitudes and phases of Vo (139), processing block 110 generates AM2AM and AM2PM distortion curves for power amplifier 130. Processing block 110 may store in memory 190, the deviations from a linear relationship, and can potentially use the deviation values to correct for the AM2AM and AM2PM distortions.

Figure 5:
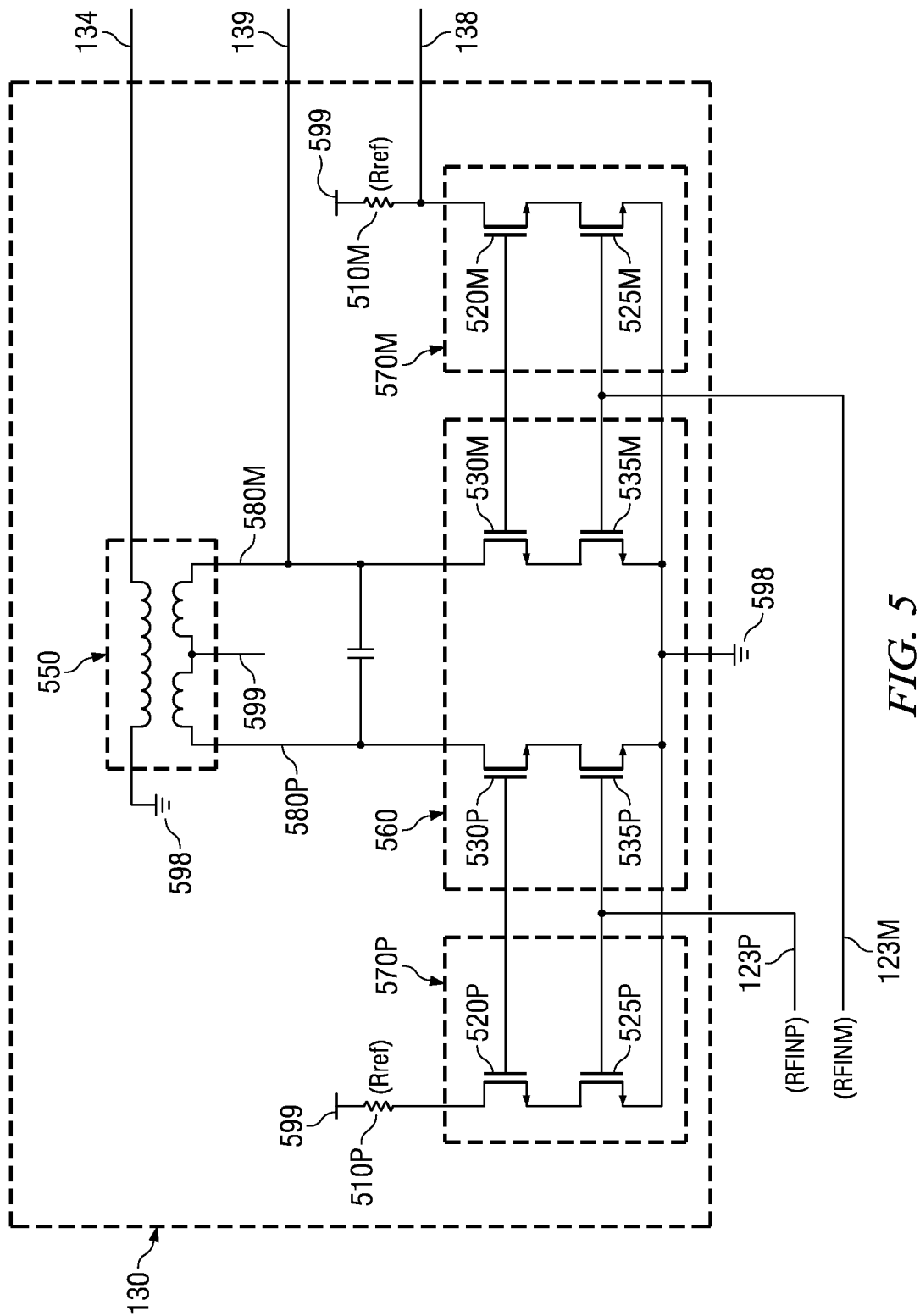
FIG. 5 is a circuit diagram illustrating the details of a power amplifier in an embodiment implemented to process differential signals.

In an embodiment, Zref (240) is implemented as a resistor (not containing a reactive part, ignoring parasitics). FIG. 5 is a diagram illustrating the details of power amplifier 130 (of FIG. 1) in an embodiment implemented to process differential signals. In the embodiment of FIG. 5, Zref (240) is implemented as resistors Rref (510P) and Rref (510M). Terminal 599 and terminals 598 respectively represent power and ground terminals.

Circuit portion 560 containing transistors 530P, 530M, 535P, and 535M may be viewed as the 'main power amplifier', receives differential input 123P(RFINP)/123M (RFINM), and generates an amplified signal across terminals 580P and 580M. Circuit portion 560 in the embodiment corresponds to transistor 220 of FIG. 2. The amplified differential output across terminals 580P and 580M is converted to single-ended form (path 134) by balun 550. Rref can be implemented on-chip with good accuracy by resistor-trimming or other well-known techniques, thereby enabling accurate measurement of Zin.

Circuit portions 570P and 570M may together be viewed as the 'auxiliary' power amplifier, receive differential input 123P/123M, and together correspond to transistor 250 of FIG. 2. Path 138 provides reference voltage Vref. Signals on paths 139 and 138 may be processed in a manner described above to measure Zin. The widths of transistors 520P and 520M may be implemented to be a ratio (1/N) of the widths respectively of transistors 530P and 530M. Similarly, the widths of transistors 525P and 525M may be implemented to be (1/N) respectively of the widths of transistors 535P and 535M.

Figure 6:
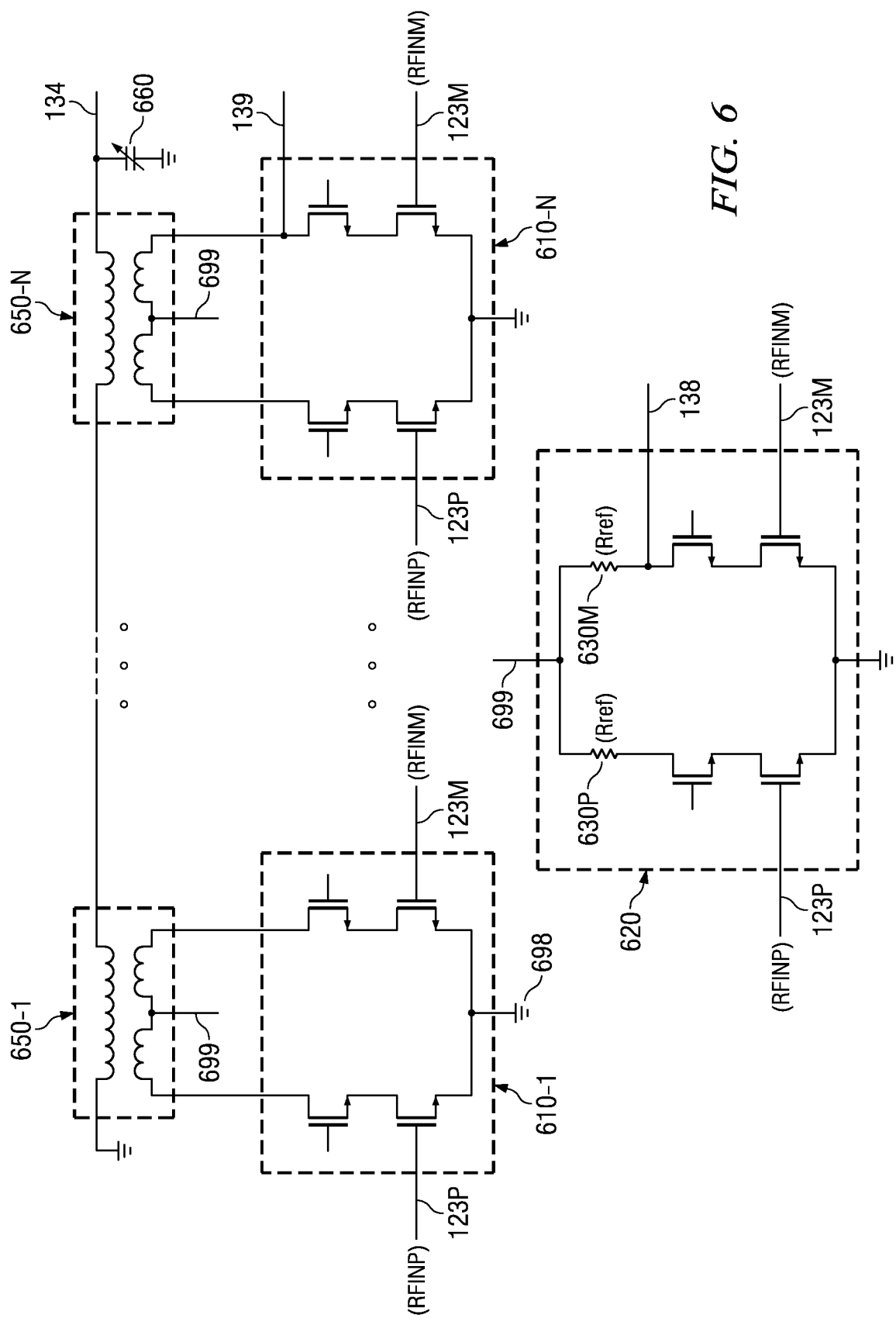
FIG. 6 is a circuit diagram illustrating the details of a power amplifier containing multiple amplification stages in an embodiment, with outputs of the stages combined to provide a final amplified output.

The techniques and/or circuit structures described above can be applied in embodiments in which power amplifier 130 is implemented to contain multiple stages, with the outputs of the individual stages being combined using power-combiner techniques, well-known in the relevant arts. An example implementation is illustrated with respect to FIG. 6. The power amplifier of FIG. 6 is shown containing amplification stages 610-1 through 610-N, corresponding components of each stage receiving inputs (123P/RFINP and 123M/RFINM) in differential form. The outputs of the stages are combined via corresponding BALUNS 650-1 through 650-N as shown in Figure, to provide amplified output 134.

The power amplifier contains an auxiliary amplifier portion 620, which also receives inputs (123P/RFINP and 123M/RFINM), and contains reference impedances 630P and 630M (shown implemented as resistances Rref). Path 138 provides reference voltage Vref. Signals on paths 139 and 138 may be processed in a manner described above to measure Zin. Terminals 699 and 698 represent power and ground terminals respectively. Capacitor 660 is a tunable capacitor.

It should be appreciated that the module thus implemented can be deployed in various devices (e.g., laptop computers, cell-phones, wireless transceivers). The devices may accordingly contain power supply (e.g., batteries, regulated power supplies, etc.) to provide power to various blocks described above.

It should be further appreciated that the specific type of transistors (NMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-type MOS) transistors (or a combination of PMOS and NMOS transistors), while also interchanging the connections to power and ground terminals.

Accordingly, in the instant application, power and ground terminals are referred to as constant reference potentials, the source and drain terminals of transistors (though which a current path is provided when turned on and an open path is provided when turned off) are termed as current terminals, and the gate terminal is termed as a control terminal. Furthermore, though the terminals are shown with direct connections to various other terminals, it should be appreciated that additional components (as suited for the specific environment) may also be present in the path, and accordingly the connections may be viewed as being electrically coupled to the same connected terminals.

References throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A module comprising:
    an amplifier to receive an input signal and to generate a first amplified signal on a first path and a second amplified signal on a second path, said first path being characterized by a looking-in impedance driven by said amplifier;
    wherein each of said first amplified signal and said second amplified signal are amplified versions of said input signal;
    a load having a predetermined impedance coupled to said second path; and
    a computation block coupled to said first and second paths and configured to produce first and second digital values that respectively represent said first and second amplified signals, said computation block further configured to compute a magnitude and a phase angle of said looking-in impedance in digital domain based on a third digital value that represents said predetermined impedance and based on said first and second digital values.

2. The module of claim 1, wherein said amplifier is a power amplifier, said first path being coupled to an antenna, wherein said looking-in impedance includes an impedance of said antenna.

3. The module of claim 2, wherein said looking-in impedance varies during an operation of said module, and wherein said computation block computes said magnitude and said phase angle during said operation, and said computation block is contained within said module during said operation.

4. The module of claim 2, wherein said amplifier comprises:
    a first transistor; and
    a second transistor,
    wherein a control terminal of each of said first transistor and second transistor is coupled to receive said input signal,
    wherein a first current terminal of said first transistor and a first current terminal of said second transistor are coupled to a first constant reference potential,
    wherein a second current terminal of said second transistor and a second current terminal of said second transistor are coupled to a second constant reference potential,
    wherein said first path is coupled to said first current terminal of said first transistor,
    wherein said load is coupled between said first current terminal and said second current terminal of said second transistor.

5. The module of claim 4, wherein said load and said amplifier are implemented on a same integrated circuit, thereby enabling implementation of said load with precision, whereby said magnitude and said phase angle are computed with accuracy.

6. The module of claim 5, wherein said second transistor has a width smaller than the width of said first transistor.

7. The module of claim 6, wherein the width of said second transistor is 100 to 200 times smaller than the width of said first transistor.

8. The module of claim 6, wherein said computation block further comprises:
    a receive processing chain to down-convert said first amplified signal and said second amplified signal, and to perform analog to digital conversion of corresponding in-phase and quadrature components resulting from the down-conversion; and
    a processor to receive said corresponding in-phase and quadrature components to compute said magnitude and said phase angle of said looking-in impedance in digital domain based on the differences in the widths of said first transistor and said second transistor, and also said pre-determined impedance.

9. The module of claim 8, wherein said processor operates to adjust the characteristics of said amplifier and said antenna to perform impedance-matching of the output impedance of said power amplifier and said looking-in impedance.

10. The module of claim 1, wherein said input signal is received in differential form and said amplifier processes said input signal in differential form, wherein an output of said amplifier is converted to single ended form.

11. An article of manufacture comprising:
    an amplifier to receive an input signal and to generate a first amplified signal on a first path and a second amplified signal on a second path;
    wherein each of said first amplified signal and said second amplified signal are amplified versions of said input signal, said first path being characterized by a looking-in impedance driven by said amplifier;
    a load having a predetermined impedance coupled to said second path; and
    a computation block coupled to said first and second paths and configured to produce first and second digital values that respectively represent said first and second amplified signals, said computation block further configured to compute a magnitude and a phase angle of said looking-in impedance in digital domain based on a third digital value that represents said predetermined impedance and based on said first and second digital values.

12. The article of manufacture of claim 11, wherein said amplifier is a power amplifier, said article further comprising an antenna, said first path being coupled to said antenna, wherein said looking-in impedance includes an impedance of said antenna.

13. The article of claim 12, wherein said looking-in impedance varies during an operation of said article, and wherein said computation block computes said magnitude and said phase angle during said operation, and said computation block is contained within said article during said operation.

14. The article of claim 12, wherein said amplifier comprises:
    a first transistor; and
    a second transistor,
    wherein a control terminal of each of said first transistor and said second transistor is coupled to receive said input signal,
    wherein a first current terminal of said first transistor and a first current terminal of said second transistor are coupled to a first constant reference potential,
    wherein a second current terminal of said second transistor and a second current terminal of said second transistor are coupled to a second constant reference potential, wherein said first path is coupled to said first current terminal of said first transistor, wherein said load is coupled between said first current terminal and said second current terminal of said second transistor.

15. The article of claim 14, wherein said second transistor has a width smaller than the width of said first transistor.

16. The article of claim 15, wherein said computation block further comprises:

a receive processing chain to down-convert said first amplified signal and said second amplified signal, and to perform analog to digital conversion of corresponding in-phase and quadrature components resulting from the down-conversion; and a processor to receive said corresponding in-phase and quadrature components to compute said magnitude and said phase angle of said looking-in impedance in digital domain based on the differences in the widths of said first transistor and said second transistor, and also said pre-determined impedance.

17. The article of claim 16, further comprising a transmit processing chain to receive transmit data from said processor, and to generate a modulated signal, wherein said modulated signal is said input signal.

18. The article of claim 17, further comprising:

a receive antenna to receive a second signal from a wireless medium;

a receive filter to provide a first filtered signal to said receive processing chain by filtering said second signal;

a transmit filter to provide a second filtered signal by filtering said first amplified signal; and an antenna tuning network, wherein said processor operates to adjust the characteristics of said amplifier and said antenna tuning network to perform impedance-matching of the output impedance of said power amplifier and said looking-in impedance.

19. The article of claim 18, further comprising a power supply to provide power to said amplifier, said processor, said receive processing chain, and said transmit processing chain.

20. The invention of claim 19, wherein said article is comprised in a device.

* * * * *